US012690253B2

(12) United States Patent
    Germana-Carpineto et al.

(10) Patent No.: US 12,690,253 B2
(45) Date of Patent: Jul. 21, 2026

(54) ELECTRONIC DEVICE COMPRISING TRANSISTORS

(71) Applicant: STMICROELECTRONICS (ROUSSET) SAS, Rousset (FR)

(72) Inventors: Rosalia Germana-Carpineto, Antibes (FR); Lia Masoero, Marseilles (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 575 days.

(21) Appl. No.: 17/970,351

(22) Filed: Oct. 20, 2022

(65) Prior Publication Data

US 2023/0134063 A1      May 4, 2023

(30) Foreign Application Priority Data

Oct. 29, 2021      (FR) ...................................... 2111559

(51) Int. Cl.
    *H10D 30/66*      (2025.01)
    *H10D 64/00*      (2025.01)
    *H10D 84/00*      (2025.01)
    *H10D 84/80*      (2025.01)

(52) U.S. Cl.
    CPC ......... *H10D 64/117* (2025.01); *H10D 30/668* (2025.01); *H10D 84/143* (2025.01); *H10D 84/811* (2025.01); *H10D 84/817* (2025.01)

(58) Field of Classification Search
    CPC ... H10D 84/143; H10D 84/811; H10D 62/117
    See application file for complete search history.

(56) References Cited

U.S. PATENT DOCUMENTS

| | | |
|---|---|---|
| 2003/0080355 A1 | 5/2003 | Shirai et al. |
| 2004/0084722 A1 | 5/2004 | Yamaguchi et al. |
| 2007/0278568 A1 | 12/2007 | Williams et al. |
| 2008/0265241 A1 | 10/2008 | Foerster |
| 2011/0291186 A1 | 12/2011 | Yilmaz et al. |
| 2012/0086066 A1 | 4/2012 | Kim et al. |
| 2013/0075810 A1 | 3/2013 | Hsieh |
| 2014/0084363 A1 | 3/2014 | Pearse et al. |
| 2014/0220761 A1 | 8/2014 | Molloy et al. |
| 2014/0264433 A1 | 9/2014 | Hu et al. |
| 2015/0263146 A1 | 9/2015 | Ogura et al. |
| 2016/0247916 A1 | 8/2016 | Stefanov et al. |
| 2016/0268423 A1 | 9/2016 | Koepp et al. |

(Continued)

FOREIGN PATENT DOCUMENTS

| | | |
|---|---|---|
| CN | 103165603 A | 6/2013 |
| CN | 103681864 A | 3/2014 |

(Continued)

OTHER PUBLICATIONS

Saxena et al., "Cathode short structure to enhance the robustness of bidirectional power MOSFETs," 2018 IEEE 30th International Symposium on Power Semiconductor Devices and ICs (ISPSD), 2018, pp. 479-482.

*Primary Examiner* — Yu Chen

(74) *Attorney, Agent, or Firm* — Seed IP Law Group LLP

(57) ABSTRACT

The present description concerns an electronic device comprising a semiconductor substrate, transistors having their gates contained in first trenches extending in the substrate, and at least one electronic component, different from a transistor, at least partly formed in a first semiconductor region contained in a second trench extending in the semiconductor substrate parallel to the first trenches.

20 Claims, 14 Drawing Sheets

(56) References Cited

U.S. PATENT DOCUMENTS

| | | | |
|---|---|---|---|
| 2018/0138273 | A1 | 5/2018 | Tsuji |
| 2018/0301553 | A1 | 10/2018 | Weyers et al. |
| 2019/0288103 | A1 | 9/2019 | Nishiwaki et al. |
| 2019/0305079 | A1 | 10/2019 | Osuga et al. |
| 2020/0312975 | A1 | 10/2020 | Fukuda et al. |
| 2021/0234014 | A1 | 7/2021 | Germana-Carpineto |
| 2023/0121961 | A1 | 4/2023 | Germana-Carpineto et al. |

FOREIGN PATENT DOCUMENTS

| | | | |
|---|---|---|---|
| CN | 103887342 | A | 6/2014 |
| CN | 110310994 | A | 10/2019 |
| CN | 219497802 | U | 8/2023 |
| EP | 3855506 | A1 | 7/2021 |

Fig. 10G
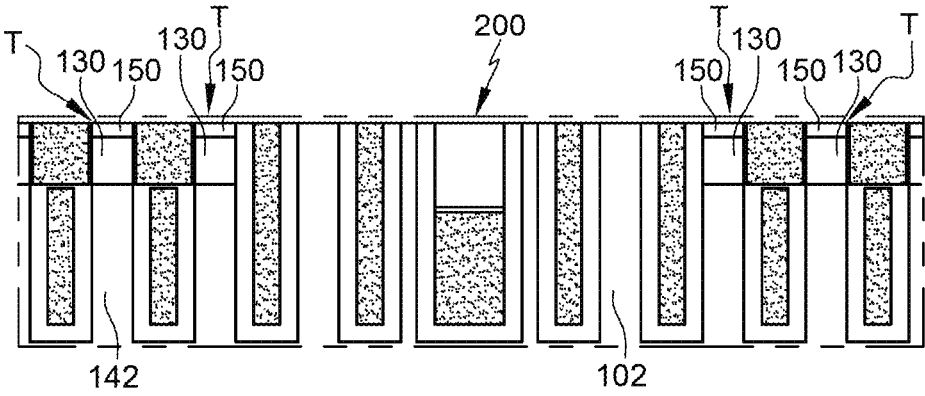
Fig. 10H
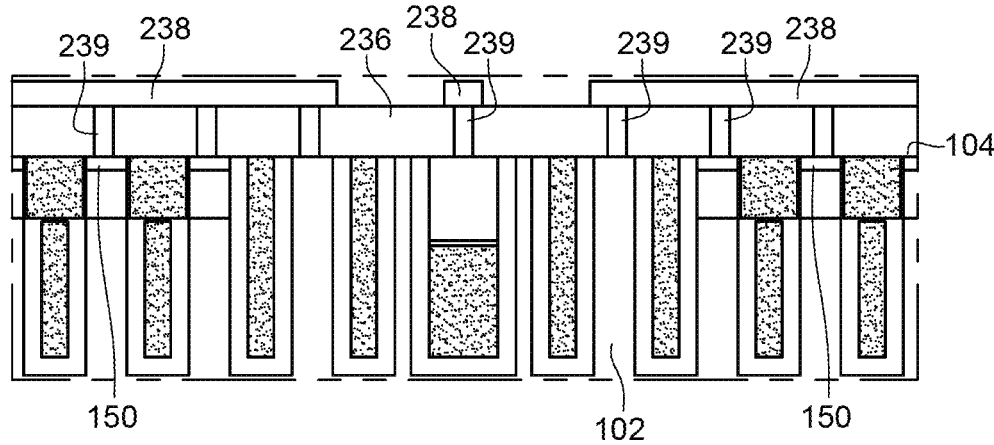
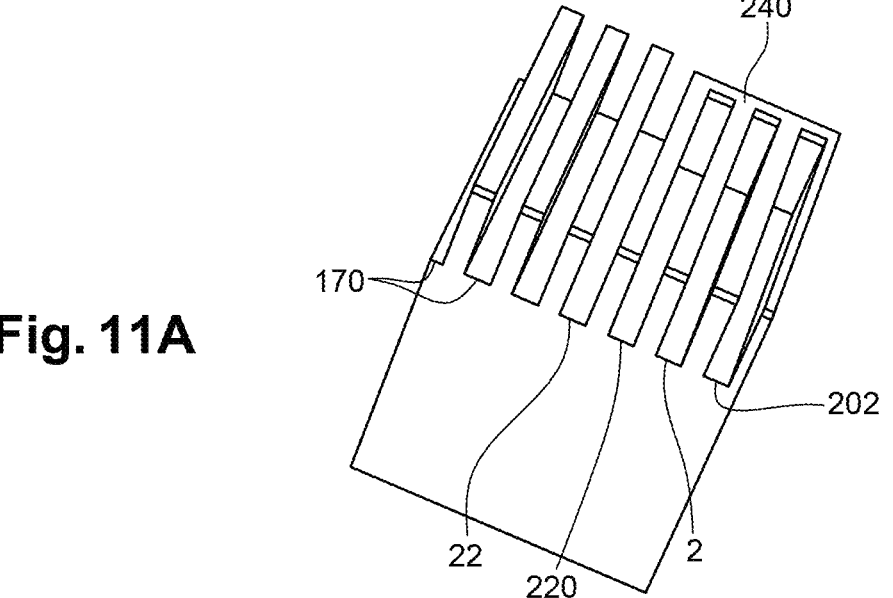
Fig. 11A

ELECTRONIC DEVICE COMPRISING TRANSISTORS

BACKGROUND

Technical Field

The present description generally concerns electronic devices, and more particularly electronic devices comprising transistors.

Description of the Related Art

In certain electronic devices, field-effect transistors are used in a non-conductive state to block high voltages, typically greater than 10 V, for example, in the order of 40 V, or even greater than 100 V.

Such devices may comprise transistor protection circuits, for example, comprising a sensor of the temperature at the level of the transistors enabling to control in adapted fashion the transistors according to the measured temperature. The temperature sensor may comprise different electronic components, for example, at least one resistor and at least one forward-biased diode, the voltage across the diode being representative of the temperature at the diode level.

BRIEF SUMMARY

An embodiment provides an electronic device comprising transistors and at least one additional electronic component.

According to an embodiment, the distance between the electronic component and the transistors is decreased.

According to an embodiment, the electronic component manufacturing steps and the transistor manufacturing steps are at partly common.

An embodiment provides an electronic device comprising a semiconductor substrate, transistors having their gates contained in first trenches extending in the substrate, and at least one electronic component, different from a transistor, at least partly formed in a first semiconductor region contained in a second trench extending in the semiconductor substrate parallel to the first trenches.

According to an embodiment, the electronic device further comprises:

a first electrically-conductive element located in the second trench, the firs semiconductor region extending in the first electrically-conductive element;

a first electrically-insulating layer between the first electrically-conductive element and the semiconductor substrate; and a second electrically-insulating layer between the first semiconductor region and the first electrically-conductive element.

According to an embodiment, the electronic device further comprises:

at least one third trench extending in the semiconductor substrate at least over a portion along the second trench, between the second trench and one of the first trenches;

a second electrically-conductive element contained in the third trench; and a third electrically-insulating layer between the second electrically-conductive element and the semiconductor substrate.

According to an embodiment, the electronic device comprises two third trenches extending in the semiconductor substrate on either side of the second trench.

According to an embodiment, each third trench is totally separate from the second trench.

According to an embodiment, each third trench meets at each end the second trench, the second electrically-conductive element being contiguous to the first electrically-conductive element.

According to an embodiment, the electronic device further comprises:

a fourth trench extending in the semiconductor substrate and totally surrounding the second trench and each third trench, the first trenches being on the side of the fourth trench opposite to the second trench;

a third electrically-conductive element contained in the fourth trench; and a fourth electrically-insulating layer between the third electrically-conductive element and the semiconductor substrate.

According to an embodiment, each transistor comprises:

a fifth electrically-insulating layer between the gate of the transistor and the semiconductor substrate and forming the gate insulator of the transistor;

a fourth electrically-conductive element located in the first trench;

a sixth electrically-insulating layer between the fourth electrically-conductive element and the semiconductor substrate;

a seventh electrically-insulating layer between the fourth electrically-conductive element and the gate;

a second semiconductor region of the semiconductor substrate, delimited by the first trench containing the gate; and a semiconductor well in contact with the second semiconductor region and the gate insulator, and having the transistor channel located therein.

According to an embodiment, the first semiconductor region is doped with a first conductivity type, the electronic device further comprising at least third and fourth semiconductor regions extending in the first semiconductor region and more heavily doped than the first semiconductor region.

According to an embodiment, the electronic device comprises second trenches extending in the semiconductor substrate and first semiconductor regions each contained in one of the second trenches, each first semiconductor region being doped with a first conductivity type, the electronic device further comprising third and fourth semiconductor regions extending in each first semiconductor region and more heavily doped than the first semiconductor regions.

According to an embodiment, the electronic device comprises third and fourth semiconductor regions extending in the first semiconductor region and more heavily doped than the first semiconductor region.

According to an embodiment, the third semiconductor regions are electrically connected in parallel and the fourth semiconductor regions are electrically connected in parallel.

According to an embodiment, at least one of the third semiconductor regions is electrically connected in series with one of the fourth semiconductor regions.

According to an embodiment, the electronic component is a diode, the third semiconductor region being doped with the first conductivity type and the fourth semiconductor region being doped with a second conductivity type opposite to the first conductivity type.

According to an embodiment, the electronic component is a resistor, the third and fourth semiconductor regions being doped with the first conductivity type.

An embodiment also provides a method of manufacturing the electronic device such as previously defined, wherein the first trenches and the second trench are formed simultaneously.

An embodiment also provides the use of the electronic device such as previously defined, wherein, in operation, the first electrically conductive element and the second electrically-conductive element are electrically connected to a source of a reference potential.

According to an embodiment, in operation, the third electrically-conductive element is electrically connected to the fourth electrically-conductive elements.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 10G illustrates another step of the method;

FIG. 10H illustrates another step of the method;

FIG. 11A illustrates a step of an embodiment of a method of manufacturing the device shown in FIGS. 2A to 2D and 3;

DETAILED DESCRIPTION

Like features have been designated by like references in the various figures. For example, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. For example, mask manufacturing steps, doping steps, and step of manufacturing terminals electrically connected to doped areas are not detailed, the described embodiments being compatible with such usual steps.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively signify "electrically insulating" and "electrically conductive."

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred, unless specified otherwise, to the orientation of the drawings or to a display screen in a normal position of use.

Unless specified otherwise, the expressions "around," "approximately," "substantially" and "in the order of" signify within 10%, and in some embodiments within 5%. Unless specified otherwise, ordinal numerals such as "first," "second," etc., are only used to distinguish elements from one another. For example, these adjectives do not limit the described embodiments to a specific order of these elements.

Figure 1:
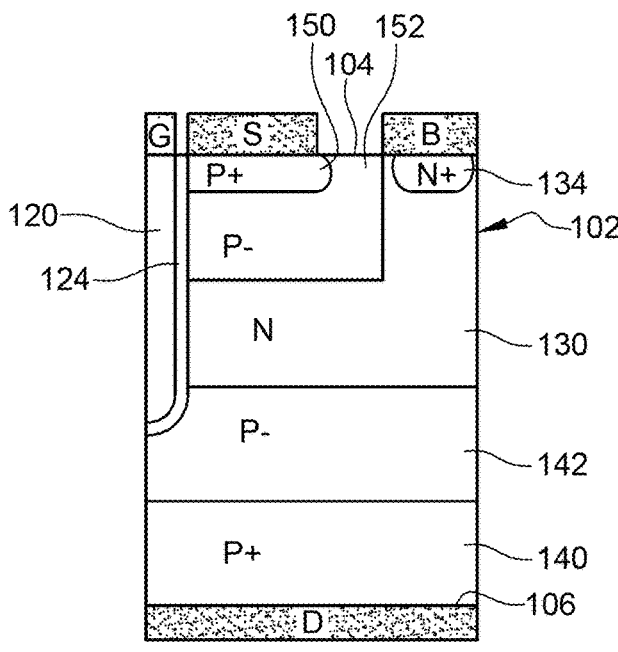
FIG. 1 is a partial simplified lateral cross-section view of an example of a vertical channel transistor.

FIG. 1 is a partial simplified cross-section view of an example of a transistor T. Transistor T is formed inside and on top of a semiconductor substrate 102 comprising a front side 104 and a back side 106, opposite to front side 104. Transistor T particularly comprises:

a gate 120 connected to a control terminal G of the transistor;

a semiconductor well 130 separated from gate 120 by a gate insulator 124 and where the channel of transistor T forms in operation. Well 130 is in some embodiments connected, via a contacting area 134, to a terminal B, called well terminal of the transistor;

doped drain/source areas 140 and 150 located on either side of well 130. Doped area 140 is in contact with a conduction terminal S, and doped area 140 is in contact with a conduction terminal D. Conduction terminal S may be on the front side 104 of substrate 102 and conduction terminal D may be on the back side 106 of substrate 102; and semiconductor regions 142, 152 called drift regions. Semiconductor region 142 is interposed between doped area 140 and well 130 and semiconductor region 152 is interposed between doped area 150 and well 130. One or more of semiconductor regions 142, 152 may be absent. The distance separating well 130 from doped area 140 and/or 150 is for example in the range from 1 μm to 5 μm, inclusive, and in some embodiments, from 2 μm to 4 μm, inclusive.

The transistor T defined by the above-described elements thus forms a field-effect transistor, that is, an electronic component likely, according to a control voltage applied between gate 120 and source terminal S, to form, in well 130, a conductive channel electrically connecting drain and source regions 140 and 150.

FIGS. 2A, 2B, 2C, and 2D partially and schematically show, respectively a top view and cross-section views of an embodiment of a device 100 comprising a plurality of transistors T, each having the structure shown in FIG. 1. Cross-section views 2B, 2C, and 2D have, as respective cross-section planes, planes 2B-2B, 2C-2C, and 2D-2D. FIG. 3 shows a partial simplified perspective view with a cross-section of half of device 100. Transistors T are partially shown in FIGS. 2A to 2D and 3. For example, the drain area 140 of each transistor T, the contacting area 134 of well 130, and drift region 152 are not shown in FIGS. 2A to 2D and 3.

Device 100 is, in some embodiments, an electronic integrated circuit chip, defined by semiconductor substrate 102 and elements, such as electronic components, located inside and on top of substrate 102.

In an example, substrate 102 is formed by a semiconductor wafer, for example, a silicon wafer. In an example, the substrate is formed by a layer located on the surface of a semiconductor wafer, for example, an epitaxial layer on a semiconductor wafer. In some embodiments, substrate 102 is a single-crystal substrate.

Transistors T are delimited by trenches 170, called transistor trenches 170 hereafter, four parallel transistor trenches being shown as an example in FIGS. 2A, 2B, 2C, and 2D. Each transistor trench 170 extends in substrate 102 from the front side 1004 of substrate 102, and a lateral wall of transistor trench 170 forms a lateral surface of the well 130 of one of transistors T. Thereby, each transistor trench 170 may delimit the lateral surfaces of the wells 130 of two transistors T. The depth of each transistor trench 170 may be in the range from 1.5 μm to 2.5 μm, inclusive, for example equal to approximately 2 μm. . As an example, each transistor trench 170 has a width W in the range from 0.1 μm to 1 μm, inclusive, for example, equal to 0.6 μm. In some embodiments, transistor trenches 170 at last partly extend along parallel directions and are regularly spaced apart. Pitch P of transistor trenches 170 may be in the range from 1 μm to 1.4 μm, inclusive.

The gate 120 of each transistor T comprises at least one electrically-conductive region extending in transistor trench 170, such as for example a metal and/or doped polysilicon. Gate insulator 124 is in contact with well 130 and with the conductive region of gate 120. Gate insulator 124 is typically formed of one or a plurality of dielectric layers, for example, the gate insulator is formed of a silicon oxide layer. The thickness of gate insulator 124 is typically smaller than 15 nm, in some embodiments in the range from 3 nm to 10 nm, inclusive. In some embodiments, gate 120 is common to the two transistors T delimited by the same transistor trench 170. As an example, transistor T is of P-channel type. Thus, doped areas 140 and 150 are P-type doped. Channel 130 is N-type doped. However, in the described embodiments, the N and P conductivity types, or doping types, may be exchanged. Operations similar to those described are then obtained by exchanging the signs of the voltages in the device. In some embodiments, the doping levels of areas 140 and 150 are high, for example, greater than $5*10^{18}$ atoms/cm$^3$, in some embodiments greater than $10^{19}$ atoms/cm$^3$. Contacting area 134, not shown in FIGS. 2A to 2D and 3, with well 130 is a doped area also having such a high doping level. The doping level of well 130 is in some embodiments smaller than $10^{18}$ atoms/cm$^3$, more in some embodiments smaller than $5*10^{17}$ atoms/cm$^3$. Each drift semiconductor region 142, 152 has a P-type doping level smaller than that of P-type doped area 150. In some embodiments, each drift semiconductor region 142, 152 has a low doping level, for example, lower than $2*10^{17}$ atoms/cm$^3$. This doping level is in some embodiments greater than $5*10^{16}$ atoms/cm$^3$.

Device 100 may further comprise, for each trench of transistor 170, an electrically-conductive element 180 located in transistor trench 170. Conductive element 180 is connected to a terminal, not shown in FIGS. 2A to 2D and 3. This terminal is in some embodiments connected to the body terminal. Conductive element 180 is located opposite at least a portion of semiconductor region 142, that is, conductive element 180 is located against an insulator 184 covering the lateral surface of at least a portion of semiconductor region 142. Insulating layer 184 separates conductive element 180 from semiconductor region 142. The distance between conductive element 180 and semiconductor region 142, corresponding to the thickness of insulating layer 184, is for example in the range from 100 nm to 200 nm, inclusive, in some embodiments in the range from 120 nm to 180 nm, inclusive. Insulating layer 184 in some embodiments has a thickness greater than that of gate insulator 124. As an example, insulating layer 184 is made of silicon oxide or of silicon nitride.

At the bottom of transistor trench 170, an insulating portion, in some embodiments, a portion of insulating layer 184, is located under conductive element 180. This portion electrically insulates conductive element 180 from the portion of substrate 102 located under conductive element 180. Further, insulating layers 186, in some embodiments, made of the same material or materials as gate insulator 124, electrically insulate conductive element 180 from gate 120.

In some embodiments, conductive element 180 is formed by a conductive wall located in a central portion of transistor trench 170. The wall extends in the same direction as the trench. The wall extends in substrate 102 orthogonally to the front side 104 of the substrate. As an example, the wall comprises, in some embodiments is made of, a metallic material or, in some embodiments, doped polysilicon. The width of the conductive wall, taken in the trench width direction, is for example in the range from 30 nm to 200 nm, inclusive.

According to an embodiment, in operation, sources S and conductive elements 180 are electrically coupled to one another.

According to an embodiment, device 100 further comprises an additional electronic component 200 different from transistor T. Electronic component 200 may form part of a circuit for controlling and/or protecting transistors T.

Device 100 comprises a trench 202 at least partly containing electronic component 200, referred to as component trench 202 herein. Component trench 202 extends in substrate 102 from the front side 104 of substrate 102. Device 100 comprises an electrically-conductive element 204 such as for example a metal and/or doped polysilicon, located in component trench 202 and an insulating layer 206 which separates conductive element 204 from substrate 102. As an example, insulating layer 206 is made of silicon oxide or of silicon nitride. The width of conductive element 204 may be in the range from 0.15 μm to 0.2 μm. The depth of component trench 202 may be in the range from 1.5 μm to 2.5 μm, for example, equal to approximately 2 μm. In some embodiments, the depth of component trench 202 is equal to the depth of transistor trench 170. Component trench 202 includes a width WTP.

Electronic component 200 extends in conductive element 204 from the front side 104 of substrate 102. Electronic component 200 comprises a doped semiconductor region 210 of a first conductivity type which extends in conductive element 204 from the front side 104 of substrate 102 and which is electrically insulated from conductive element 204 by an insulating layer 212. As an example, insulating layer 212 is made of silicon oxide or of silicon nitride. Electronic component 200 further comprises a doped semiconductor region 214 of the first conductivity type and more heavily doped than semiconductor region 210, and a doped semiconductor region 216 of a second conductivity type, opposite to the first conductivity type, semiconductor regions 214 and 216 each extending in semiconductor region 210 from front side 104. Doped regions 214, 216 may particularly be connected to electrically-conductive tracks and form the terminals of electronic component 200. The depth of semiconductor region 210 may be in the range from 0.6 μm to 1 μm, for example, equal to approximately 0.8 μm. The width of semiconductor region 210 may be substantially equal to the width of conductive element 204, for example, in the range from 0.15 μm to 0.2 μm or equal to the width of region 120.

According to an embodiment, electronic component 200 is a diode. Semiconductor region 210 may be lightly doped with a first conductivity type, for example, type P, semiconductor region 214 may be doped with the first conductivity type, more heavily doped than semiconductor region 210, and semiconductor region 216 may be doped with a second conductivity type opposite to the first conductivity type, for example, type N, and more heavily doped than semiconductor region 210. According to an embodiment, electronic component 200 is a resistor. Semiconductor regions 210, 214, and 216 may be doped with the first conductivity type, regions 214 and 216 being more heavily doped than semiconductor region 210. The doping level of semiconductor region 210 is in some embodiments smaller than $10^{18}$ atoms/cm$^3$, more in some embodiments smaller than $5*10^{17}$ atoms/cm$^3$. In some embodiments, the doping levels of semiconductor regions 140 and 150 are high, that is, greater than $5*10^{18}$ atoms/cm$^3$, in some embodiments greater than $10^{19}$ atoms/cm$^3$.

Device 100 further comprises first trenches 220 and second trenches 221 interposed between component trench 202 and transistor trenches 170, and called protection trenches 220, 221 herein, protection trenches 220 being closer to component trench 202 than protection trenches 221. Trenches 220 and 221 may have the same structure. Each protection trench 220, 221 extends in substrate 102 from the front side 104 of substrate 102. For each protection trench 220, 221, device 100 comprises an electrically-conductive element 222, such as for example a metal and/or doped polysilicon, located in protection trench 220 and an insulating layer 224 which separates conductive element 222 from substrate 102 and an electrically-conductive element 223, such as for example metal and/or doped polysilicon, located in protection trench 221 and an insulating layer 225 which separates conductive element 223 from substrate 102. As an example, insulating layer 224, 225 is made of silicon oxide. Device 100 comprises at least protection trench 220, in some embodiments at least protection trench 220 and protection trench 221 between component trench 202 and the closest transistor trench 170. The depth of each protection trench 220, 221 may be in the range from 1.8 μm to 2.2 μm, for example, equal to approximately 2 μm. In some embodiments, the depth of each protection trench 220, 221 is equal to the depth of transistor trench 170Width WT of protection trench 220, 221 is substantially equal to width W. Width WTP is greater than or equal to width WT. In some embodiments, width WTP is greater than width WT. The width of conductive element 222, 223 may be in the range from 0.15 μm to 0.2 μm, inclusive.

Device 100 further comprises conductive tracks and conductive vias, not shown, of at least one metallization level formed on the front side 104 of substrate 102 for the connection of the sources and of the wells of transistors T and the connection of component 200.

In some embodiments, protection trench 221 totally surrounds the area of substrate 102 containing transistor trenches 170. In some embodiments, protection trench 220 totally surrounds the area of substrate 102 containing electronic component 200. In the embodiment of the device 100 shown in FIGS. 2A to 2D and 3, transistors T are present on either side of electronic component 200. As a variant, transistors T may only be present on one side of component trench 202.

Figure 2A:
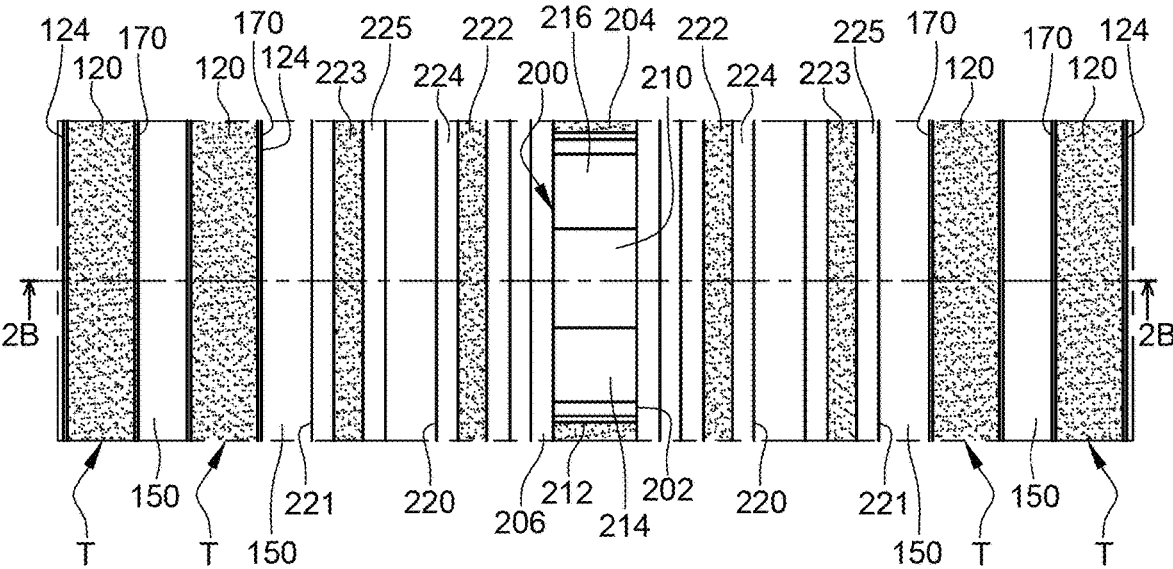
FIG. 2A is a partial simplified top view of an embodiment of an electronic device comprising transistors and an additional electronic component.
Figure 2B:
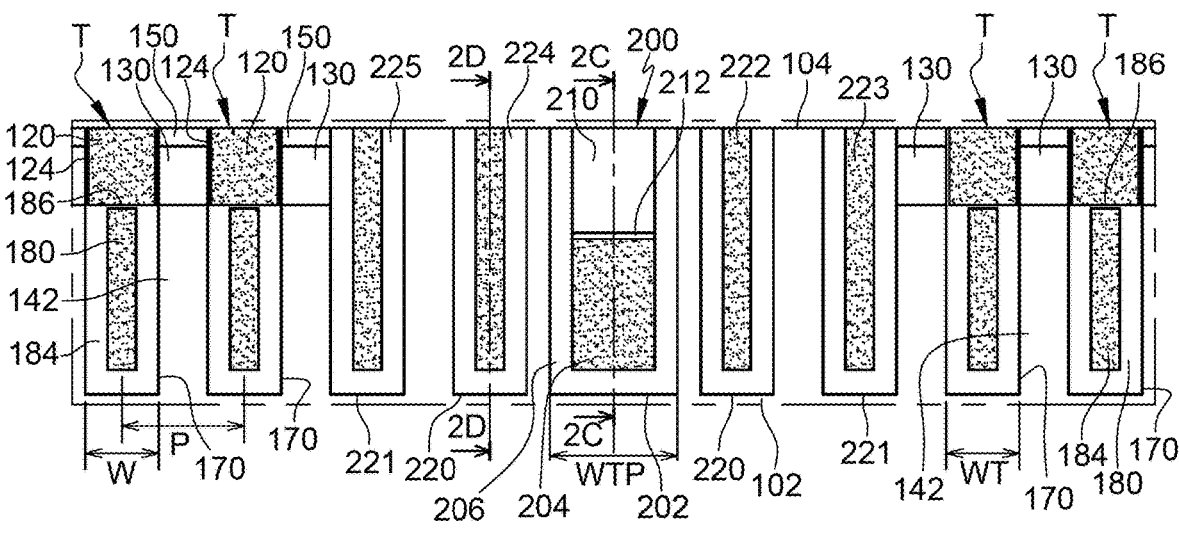
FIG. 2B is a partial simplified lateral cross-section view of the device of FIG. 2A.
Figure 2C:
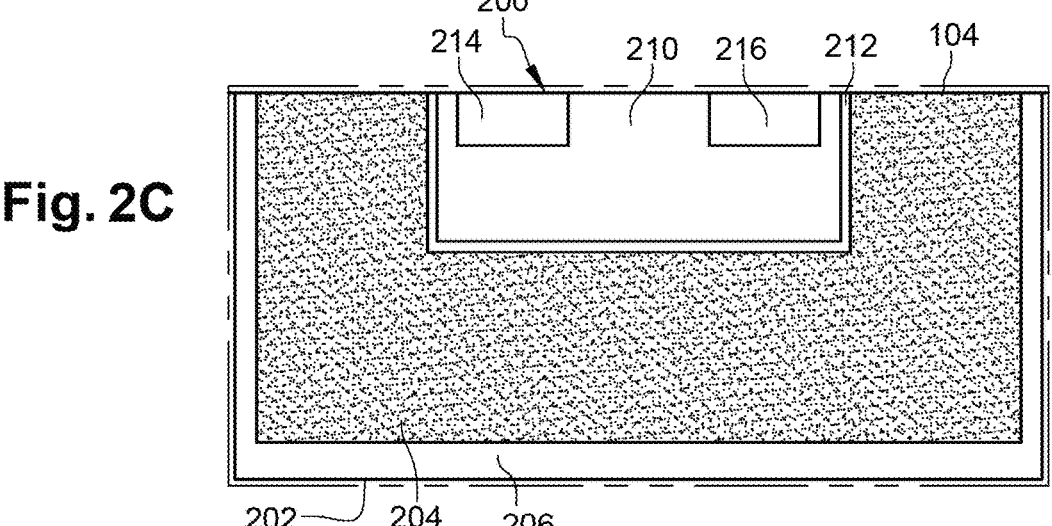
FIG. 2C is another partial simplified lateral cross-section view of the device of FIG. 2A.
Figure 2D:
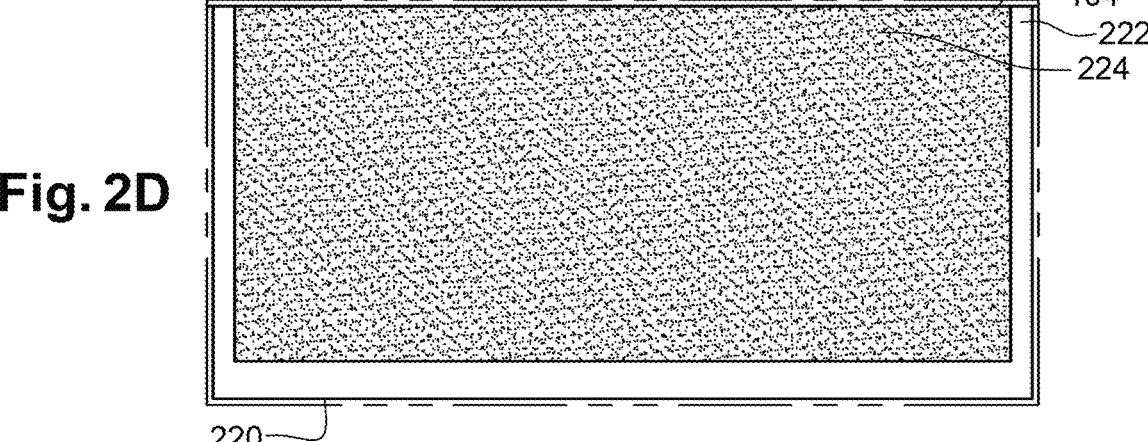
FIG. 2D is another partial simplified lateral cross-section view of the device of FIG. 2A.
Figure 3:
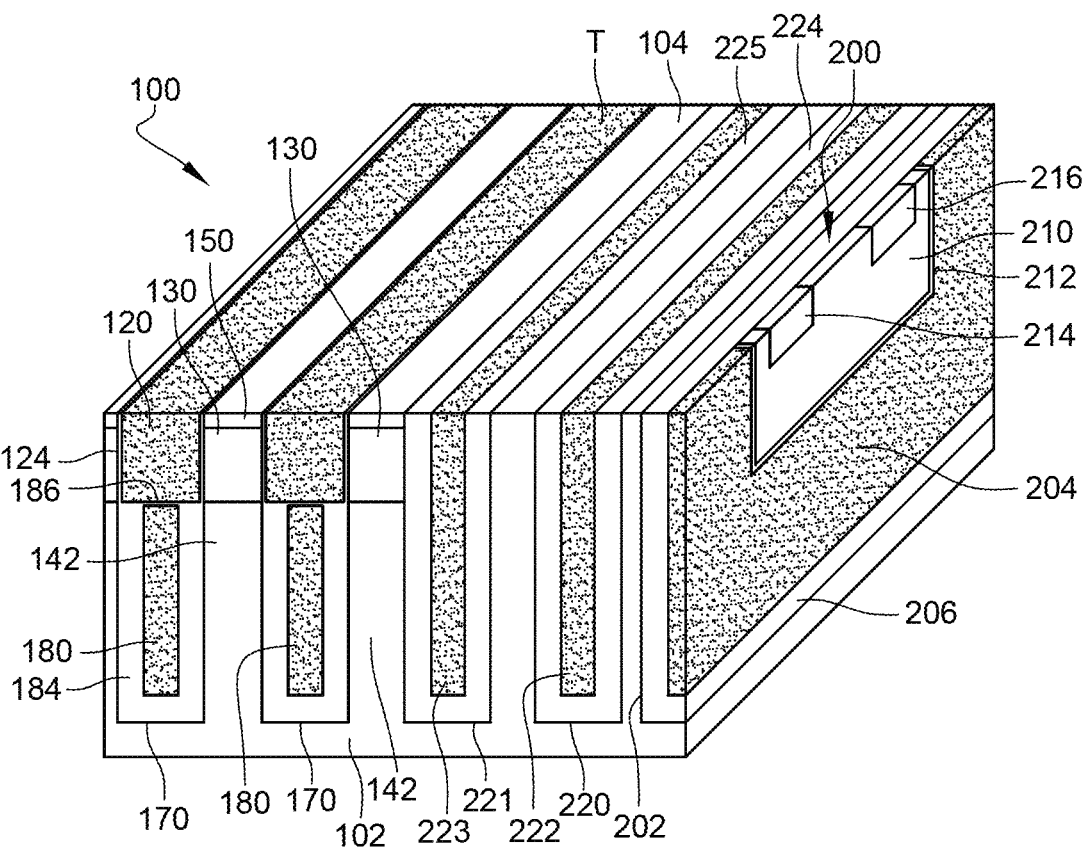
FIG. 3 is a partial simplified perspective view, in cross-section, of the device of FIGS. 2A to 2D.
Figure 4:
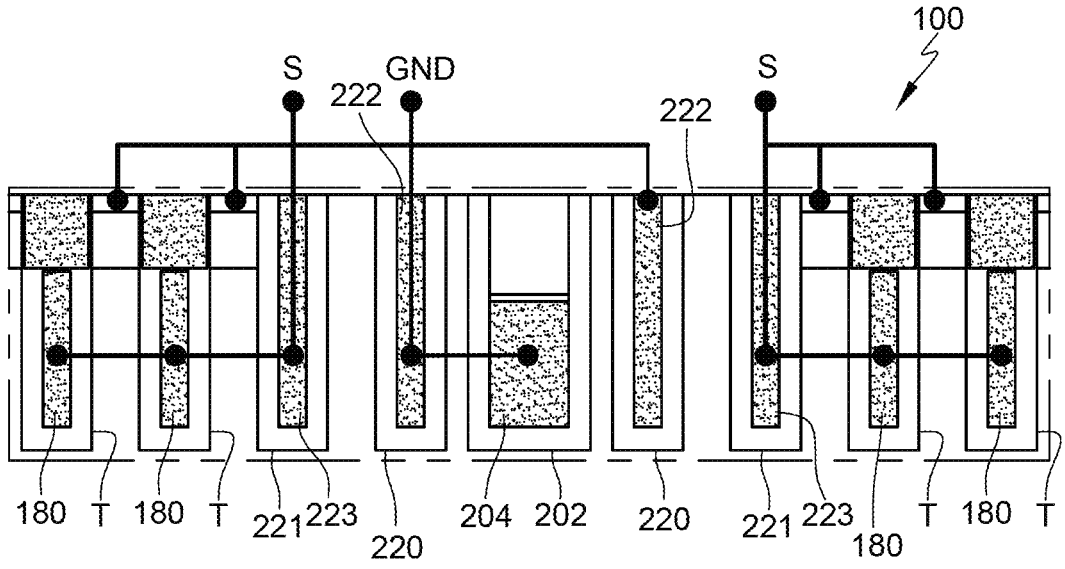
FIG. 4 is a partial simplified lateral cross-section view similar to FIG. 2B illustrating an embodiment of the connections of the elements of the device shown in FIGS. 2A to 2D and 3.

FIG. 4 is a partial simplified cross-section view similar to FIG. 2B illustrating an embodiment of the connections of the elements of device 100. The connections may be formed by the metal tracks of the metallization levels of device 100 which are schematically shown by black lines and dots in FIG. 4.

According to an embodiment, the conductive element 222 present in each protection trench 220 is electrically connected to the conductive element 204 present in component trench 202. According to an embodiment, the conductive element 204 present in component trench 202 is connected to the source of the low reference potential of device 100, for example, ground GND. According to an embodiment, the conductive element 222 present in each protection trench 220 is also electrically connected to the source of lower reference potential GND of device 100. According to an embodiment, the conductive element 222 present in each protection trench 220 may be electrically connected to a common source terminal S of transistors T, particularly in the case where electronic component 200 is not surrounded with transistor trenches 170. According to an embodiment, when electronic component 200 is a diode, the conductive element 222 present in each protection trench 220 may be electrically connected to the cathode 214 of diode 200 and to conductive element 204, for example, when diode 200 and its protection trench 220 are surrounded with transistor trenches 170. According to an embodiment, when protection trenches 221 are present between component trench 202 and the closest transistor trench 170, the conductive element 223 present in protection trench 221 is electrically connected to a common source terminal S of transistors T. The conductive elements 180 of transistors T may also be electrically connected to source terminal S. Low reference potential GND and the potential at source S may be different.

The protection trenches 220, 221 around component 200 advantageously enable to maintain a substantially constant low electrostatic potential close to electronic component 200, for example an electrostatic potential which does not vary with the potential of the sources, of the gates, of the drains, and of the wells of transistors T.

As an example, the drain of transistors T may be taken in operation to a potential from 40 V to 45 V. All transistors T are in the conductive state, the voltage between the gate and the source of each transistor T is approximately 10 V, and the potential at the source is approximately 40 V-45 V. The conductive elements 222 of protection trenches 220 and the conductive element 204 of component trench 202 are set to approximately 40 V-45 V. When transistors T are in the non-conductive state, the voltage between the gate and the source of each transistor T is approximately 0 V and the potential at the source is approximately 0 V. The conductive elements 222 of protection trenches 220 and the conductive element 204 of component trench 202 are at approximately 0 V.

Figure 5:
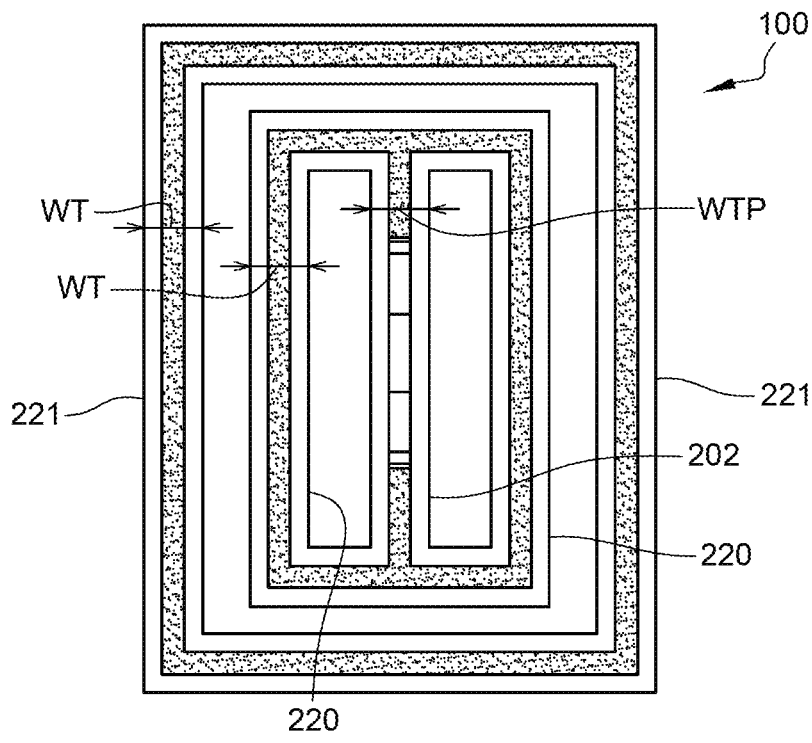
FIG. 5 is a partial simplified top view of an embodiment of the device shown in FIGS. 2A to 2D and 3.
Figure 6:
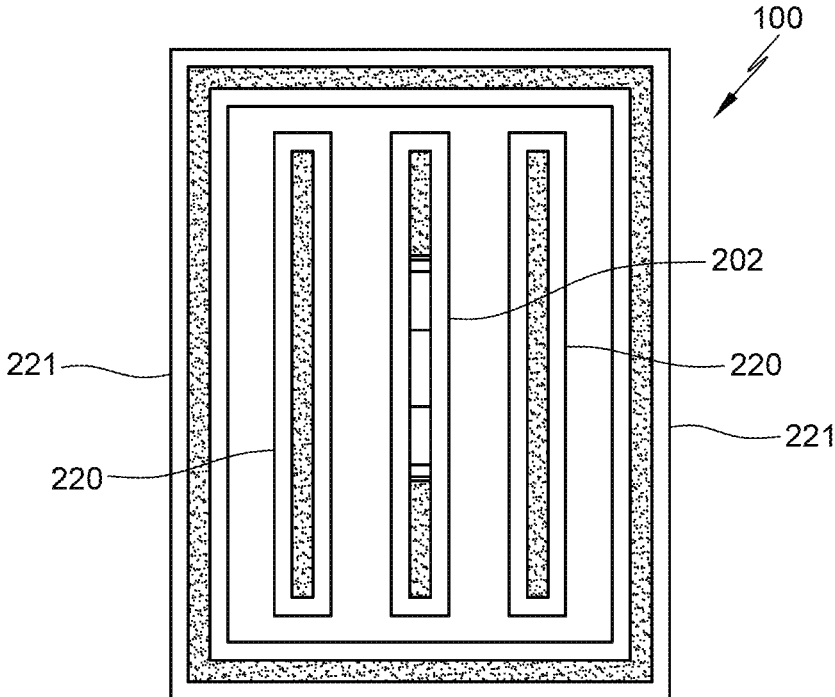
FIG. 6 is a partial simplified top view of another embodiment of the device shown in FIGS. 2A to 2D and 3.

FIGS. 5 and 6 are partial simplified cross-section views of embodiments of structures at the longitudinal ends of component trench 202 of the device 100 shown in FIGS. 2A to 2D and 3. In FIGS. 5 and 6, the width WTP of component trench 202 is equal to the width WT of each protection trench 220 and 221. The protection trenches 221 most distant from component trench 202 meet at their ends to totally surround component trench 202. This means that the conductive elements 223 of protection trenches 221 are connected together at their ends.

In the embodiment of FIG. 5, the protection trenches 220 closest to component trench 202 meet at their ends to totally surround component trench 202, component trench 202 also meeting at its ends protection trenches 220. This means that the conductive elements 222 in protection trenches 220 are connected together at their ends and also connected to the ends of the conductive element 204 contained in component trench 202. In the embodiment of FIG. 6, the protection trenches 220 closest to component trench 202 are separate and extend parallel to component trench 202.

Figure 7:
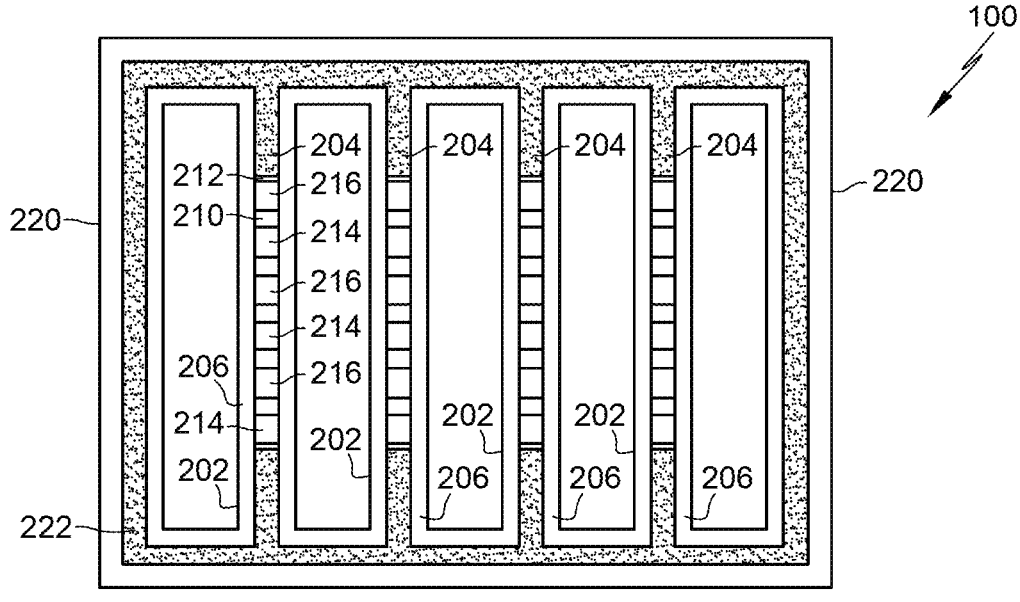
FIG. 7 is a partial simplified top view of a variant of the device shown in FIG. 5.

FIG. 7 is a partial simplified top view of a variant of electronic device 100.

According to this variant, device 100 comprises N component trenches 202, N being an integer greater than 2, for example, capable of varying from 2 to 4. The N component trenches 202 may extend in parallel fashion. Each component trench 202 contains the electrically-conductive element 204 located in component trench 202, the insulating layer 206 which separates conductive element 204 from substrate 102, the doped semiconductor region 210 of the first conductivity type which extends in conductive element 204 from the front side 104 of substrate 102 and which is electrically insulated from conductive element 204 by an insulating layer 212. Electronic component 200 further comprises, for each component trench 202, M doped semiconductor regions 214 of the first conductivity type and more heavily doped than semiconductor region 210 and M doped semiconductor regions 216 of the second conductivity type and more heavily doped than semiconductor region 210, M being an integer greater than 2, for example varying from 2 to 60. Regions 214 and 216 are alternated along the longitudinal direction of component trench 202 and each extend in semiconductor region 210 from front surface 104. In some embodiments, the semiconductor regions 214, 216 located at the two longitudinal ends of semiconductor region 210 are of opposite conductivity types. The alternations of semiconductor regions 214, 216 between two adjacent component trenches 202 may be inverted. The connections of semiconductor regions 214 and of semiconductor regions 216 depend on the desired properties of electronic component 200.

Figure 8:
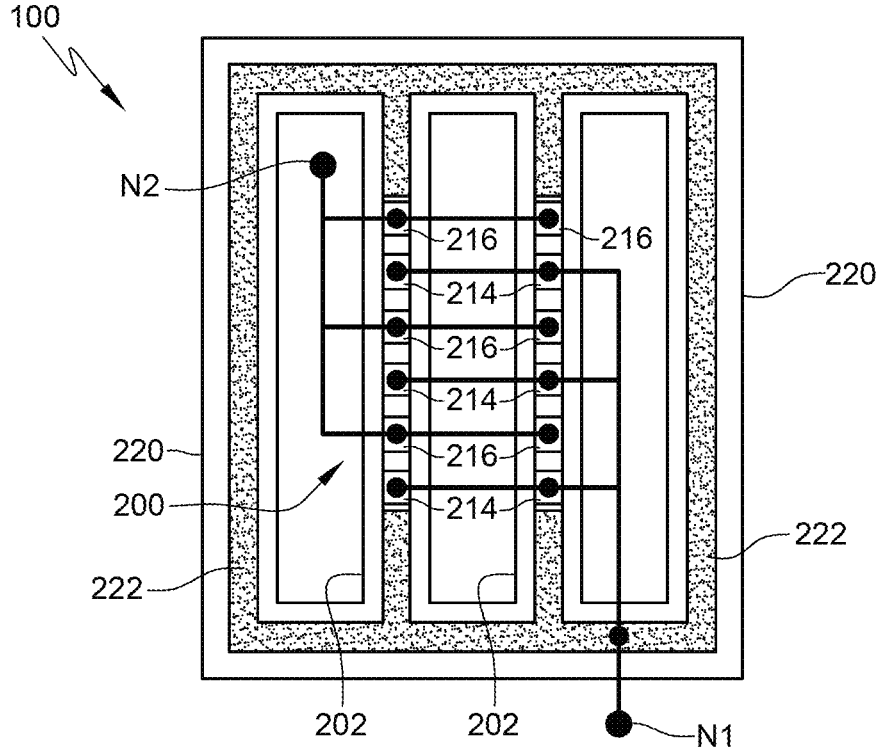
FIG. 8 is a partial simplified lateral cross-section view similar to FIG. 2B illustrating an embodiment of the connections of the elements of the device shown in FIG. 7.
Figure 9:
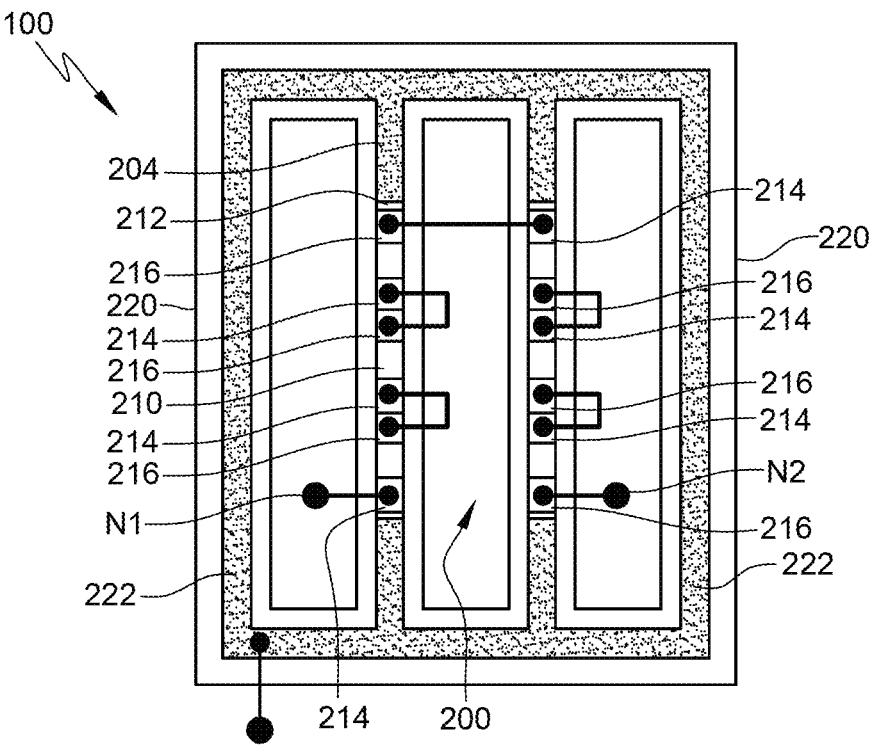
FIG. 9 is a partial simplified lateral cross-section view similar to FIG. 2B illustrating another embodiment of the connections of the elements of the device shown in FIG. 7.

FIGS. 8 and 9 each are a partial simplified lateral cross-section view, similar to FIG. 2B, illustrating an embodiment of the connections of the elements of the device 100 shown in FIG. 7 in the case where device 100 comprises first and second component trenches 202, each comprising an alternation of three P-type doped semiconductor regions 214 and three N-type semiconductor regions 216. The connections may be formed by the metal tracks of the metallization levels of device 100 which are schematically shown by black lines and dots in FIGS. 8 and 9.

In the embodiment illustrated in FIG. 8, the semiconductor regions 214 of the first and second component trenches 202 are connected in parallel and the semiconductor regions 216 of the first and second component trenches 202 are connected in parallel.

Semiconductor regions 214 are connected to the first terminal N1 of component 200 and semiconductor regions 216 are connected to the second terminal N2 of component 200. In the case where, in operation, semiconductor regions 214 are intended to be connected to the source of the low reference potential of device 100, semiconductor regions 214 may further be connected to the conductive element 222 of the protection trenches 220 closest to component trenches 202.

In the embodiment illustrated in FIG. 9, semiconductor regions 214 and semiconductor regions 216 are series-connected. This means that each semiconductor region 214 is electrically connected in series with a semiconductor region 214. For each component trench 202, except for the semiconductor regions 214 and 216 located at the ends of component trench 202, each semiconductor region 214 of component trench 202 is series-connected to the semiconductor region 216 closest to the same component trench 202. The semiconductor region 216 located at a first end of first component trench 202 is series-connected to the semiconductor region 214 located at a first end of second component trench 202. The semiconductor region 214 located at the second end of first component trench 202 is connected to the first terminal N1 of component 200 and the semiconductor region 216 located at the second end of second component trench 202 is connected to the second terminal N2 of component 200. The conductive element 222 of the protection trenches 220 closest to component trenches 202 may be connected to the source of the low reference potential of device 100.

FIGS. 10A to 10H are partial simplified cross-section views of the structures obtained at steps of an embodiment of a method of manufacturing the device 100 of FIGS. 2A to 2D.

Figure 10A:
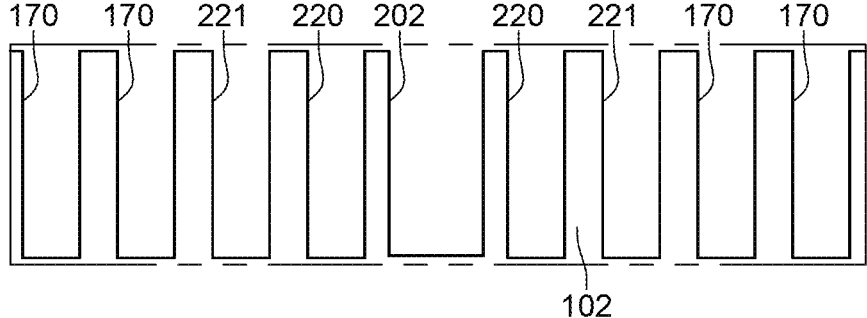
FIG. 10A illustrates a step of an embodiment of a method of manufacturing the device shown in FIGS. 2A to 2D and 3.

FIG. 10A shows the structure obtained after the forming of transistor trenches 170, of protection trenches 220, 221, and of component trench 202 in substrate 102. Trenches 170, 202, 220, and 221 may be formed by a same etch step.

Figure 10B:
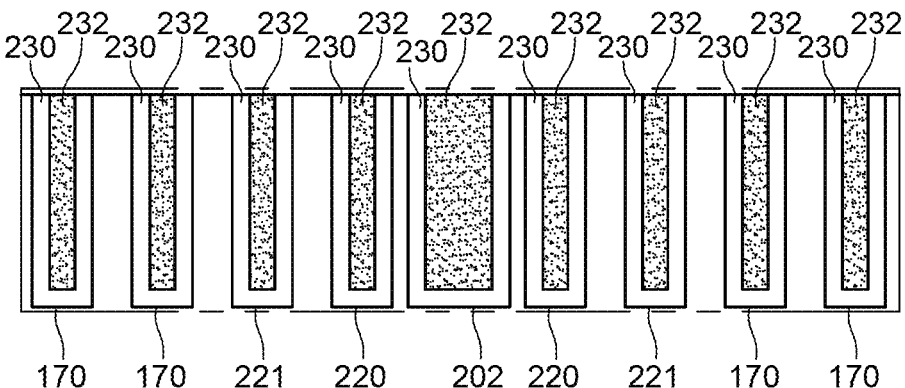
FIG. 10B illustrates another step of the method.

FIG. 10B shows the structure obtained after the forming, on the walls and the bottom of each trench 170, 202, 220, and 221, of an insulating layer 230 and of a conductive core 232. The method may comprise a conformal deposition of an insulating layer covering the structure resulting from the etching of trenches 170, 202, 220, and 221, the deposition of a conductive layer, for example, made of polysilicon, covering the insulating layer and filling the remaining space of each trench 170, 202, 220, and 221, and the removal, for example by etching, of the portions of the insulating layer and of the conductive layer located outside of trenches 170, 202, 220, and 221. As a variant, insulating layers 230 may be formed by a thermal oxidation step. The thickness of insulating layer 230 corresponds to the thickness desired for each insulating layer 184, each insulating layer 206, and each insulating layer 224, 225. The protection walls contained in protection trenches 220 and 221 are then formed.

Figure 10C:
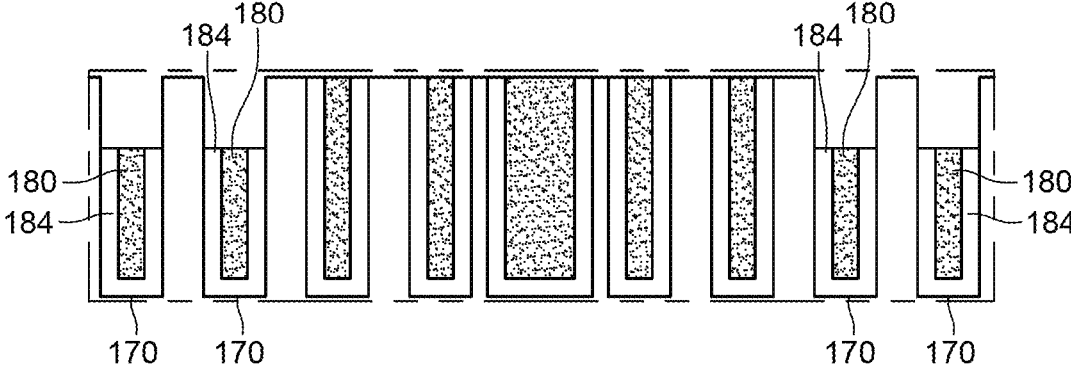
FIG. 10C illustrates another step of the method.

FIG. 10C shows the structure obtained after the etching, across a portion of the depth of each trench of transistor 170, of insulating layer 230 and of conductive core 232. The conductive elements 180 and the insulating layers 184 of the transistors are thus formed.

Figure 10D:
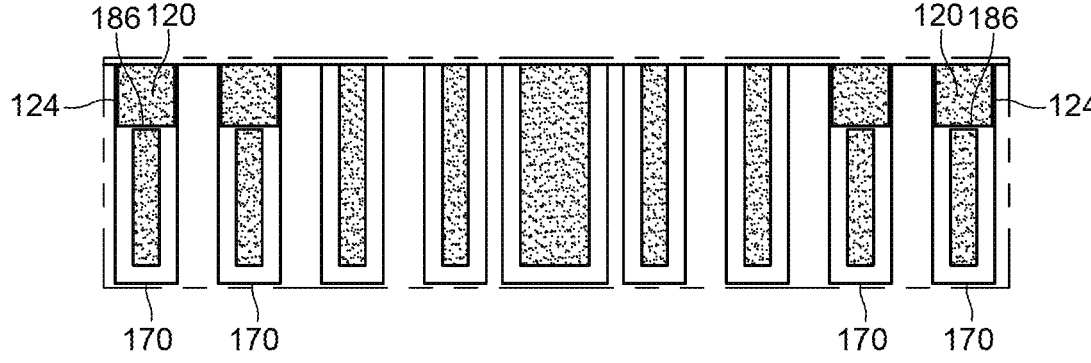
FIG. 10D illustrates another step of the method.

FIG. 10D shows the structure obtained after the forming, in each transistor trench 170, of insulating layer 186, of gate insulator 124, and of gate 120. Gate insulator 124 may be formed by thermal oxidation. The method may comprise a deposition of a conductive layer covering the insulating layer and filling the remaining space of each transistor trench 170, and the removal, for example, by etching, of the portions of the conductive layer located outside of transistor trenches 170.

Figure 10E:
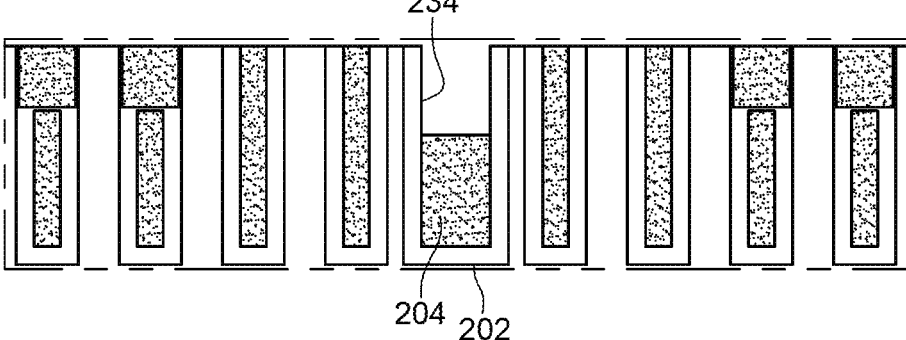
FIG. 10E illustrates another step of the method.

FIG. 10E shows the structure obtained after the etching of an opening 234 in the conductive core 232 present in component trench 202. Conductive element 204 is thus delimited.

Figure 10F:
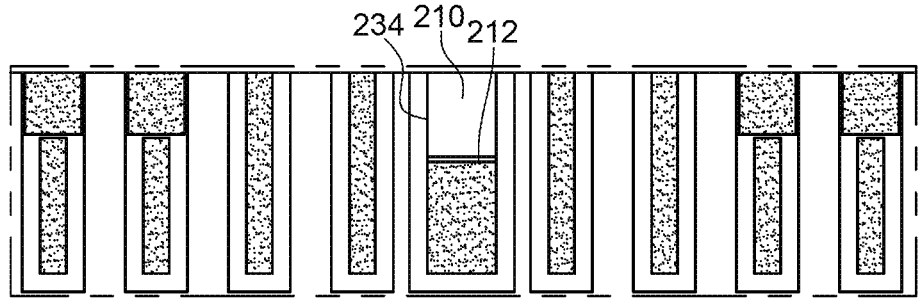
FIG. 10F illustrates another step of the method.

FIG. 10F shows the structure obtained after the forming of insulating layer 212, particularly at the bottom of opening 234, and the forming of semiconductor region 210. The forming of insulating layer 212 may comprise an oxidation step further causing the forming of insulating layers on the rest of the structure. The forming of semiconductor region 210 may comprise the deposition, over the entire structure, of a semiconductor layer, for example, polysilicon, particularly filling the remaining space of component trench 202, a step of implantation of dopants of a first conductivity type, for example, of type P, in the semiconductor layer to obtain the desired doping for semiconductor region 210, and the removal, for example, by etching, of the portions of the semiconductor layer outside of component trench 202.

FIG. 10G shows the structure obtained after a step of implantation of dopants of a second conductivity type, for example, of type N, to form the transistor wells 130 and steps of implantation of dopants of the first conductivity type and of the second conductivity type, to form the source regions 150, the drain regions 140, and the drift regions 142 of the transistors (drain regions 142 are not shown in FIG. 10G) and heavily-doped regions 212 and 214, not shown in FIG. 10G. Transistors T and electronic component 200 are thus formed.

FIG. 10H shows the structure obtained after a step of forming of the metallization levels, a single metallization level being shown in FIG. 10H. As an example, FIG. 10H shows an insulating layer 236 covering the front side 104 of substrate 102, metal tracks 238 extending on insulating layer 236, and conductive vias 239 crossing insulating layer 236 and connecting metal tracks 238 particularly to semiconductor regions 150, 214, and 216.

FIGS. 11A to 11H are partial simplified perspective views respectively similar to FIGS. 10A to 10H, of structures obtained at steps of an embodiment of a method of manufacturing device 100 with the end structure of the component trench 202 previously described in relation with FIG. 7 with two component trenches 202, and a single protection trench 220 on the right-hand side of component trenches 202.

FIG. 11A is similar to the previously described FIG. 10A, a mask 240 used for the etching of trenches 170, 202, 220, and 221 being shown in FIG. 11A.

Figures 11B, 11C:
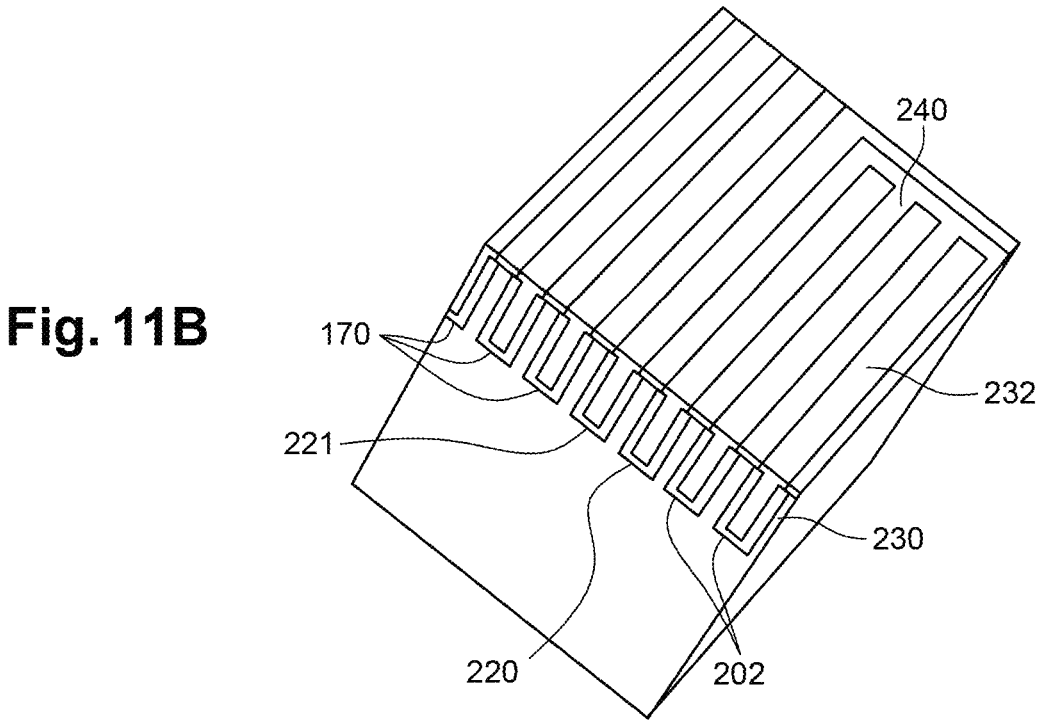
FIG. 11B illustrates another step of the method.
FIG. 11C illustrates another step of the method.

FIG. 11B is similar to the previously described FIG. 10B, mask 240 being kept during the forming of insulating layer 230 and of conductive core 232 for each trench 170, 202, 220, and 221.

FIG. 11C is similar to the previously described FIG. 10C, a mask 242 used for the etching of conductive core 232 across a portion of the depth of each transistor trench 170 being shown in FIG. 11C, while the etching of insulating layer 230 across a portion of the depth of each transistor trench 170 has not been performed yet in FIG. 11C.

Figure 11D:
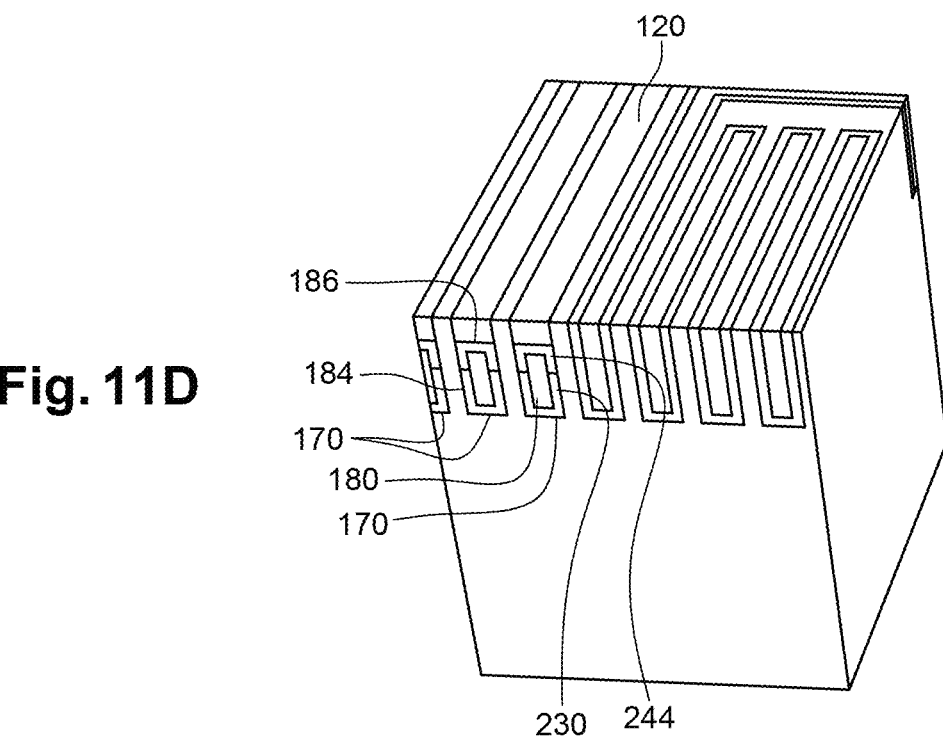
FIG. 11D illustrates another step of the method.

FIG. 11D is similar to FIG. 10D. As appears in the drawing, for each transistor trench 170, insulating layer 230 has been etched down to a depth greater than the etch depth of insulating core 232. This may occur according to the type of etching used. The forming of insulating layer 186 then comprises the forming of an insulating layer 244 covering the exposed lateral walls of conductive element 180 and the upper wall of conductive element 180. Insulating layer 184 and insulating layer 186 are thus formed.

Figure 11E:
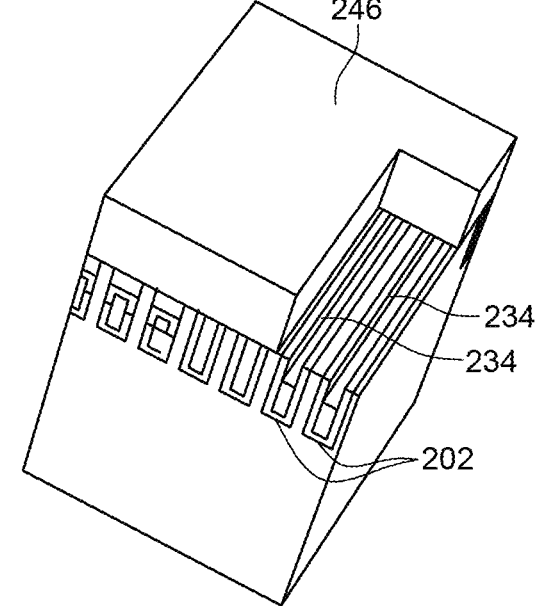
FIG. 11E illustrates another step of the method.

FIG. 11E is similar to the previously described FIG. 10E, a mask 246 used for the etching of an opening 234 in the conductive core 232 of each component trench 202 being shown in FIG. 11E. The forming of mask 246 may be preceded by a step of etching of the entire structure from the front side to remove mask 240.

Figures 11F, 11G:
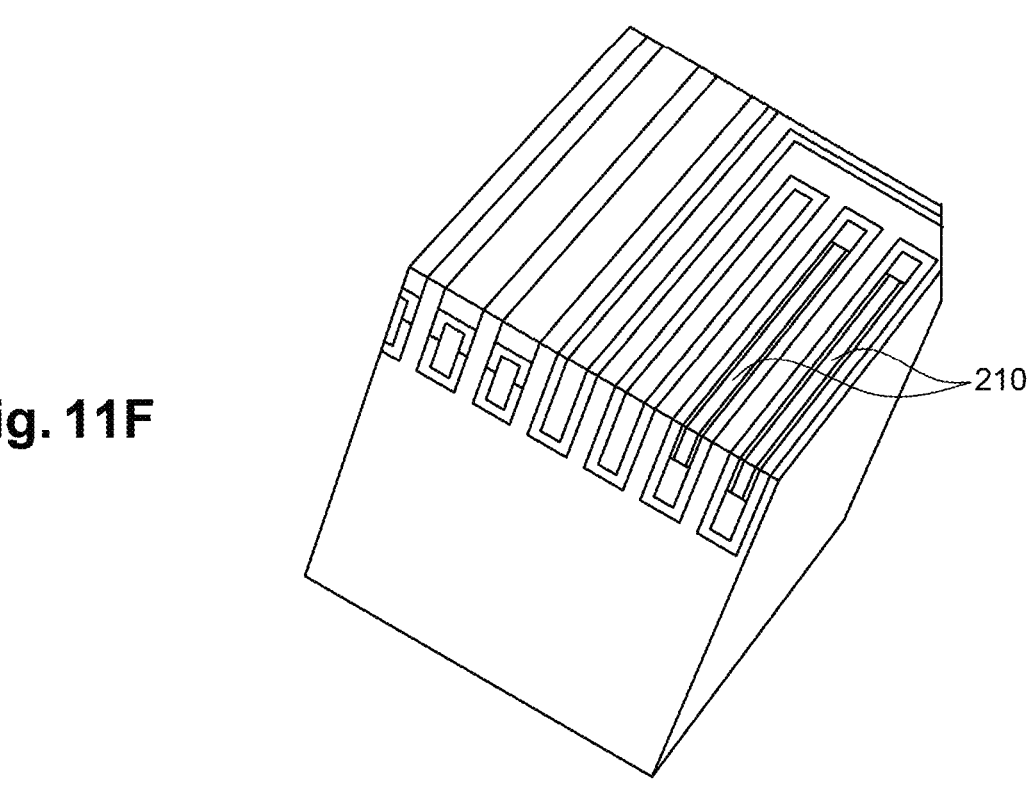
FIG. 11F illustrates another step of the method.
FIG. 11G illustrates another step of the method.

FIG. 11F is similar to the previously described FIG. 10F, and FIG. 11G is similar to the previously described FIG. 10G.

Figure 11H:
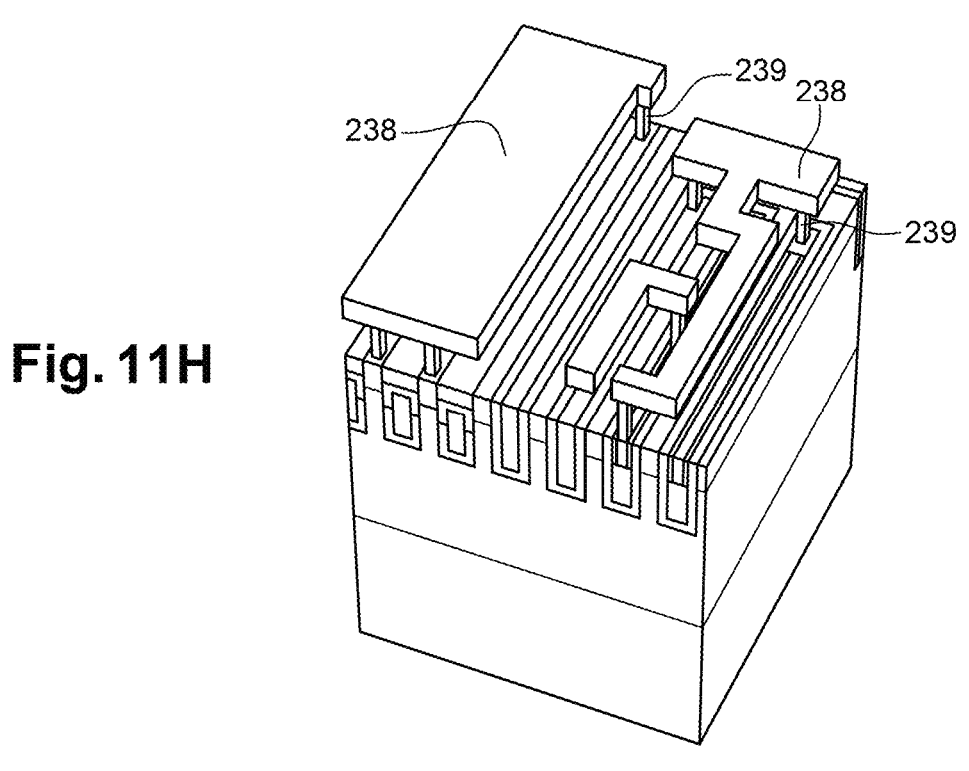
FIG. 11H illustrates another step of the method.

FIG. 11H is similar to the previously described FIG. 10H, and insulating layer 236 is not shown in FIG. 11H.

Simulations have been performed for the device 100 shown in FIGS. 2A to 2D to highlight the protection provided by the walls contains in protection trenches 202. For all simulations, the conductive elements 222 present in protection trenches 220 and the conductive element 204 present in component trench 202 are at 0 V. The simulations correspond to the situations in normal operation where maximum and minimum potentials are applied to transistors T.

Figure 12:
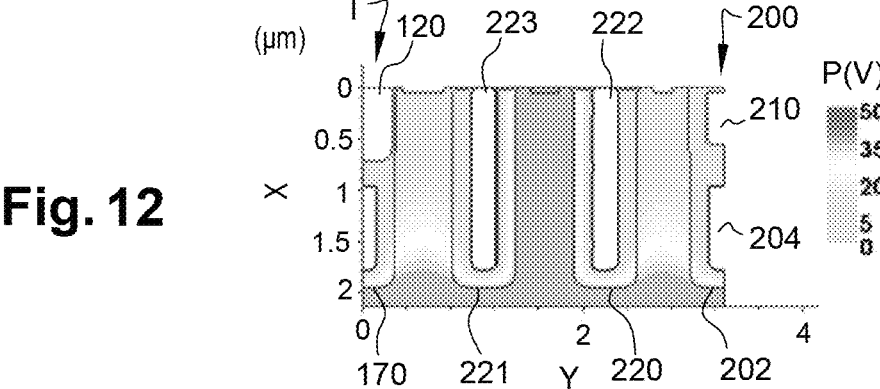
FIG. 12 is a partial simplified lateral cross-section view of the device shown in FIGS. 2A to 2D and 3 illustrating, in grey scale, the variations of the electrostatic potential in the device in a first operating configuration.
Figure 13:
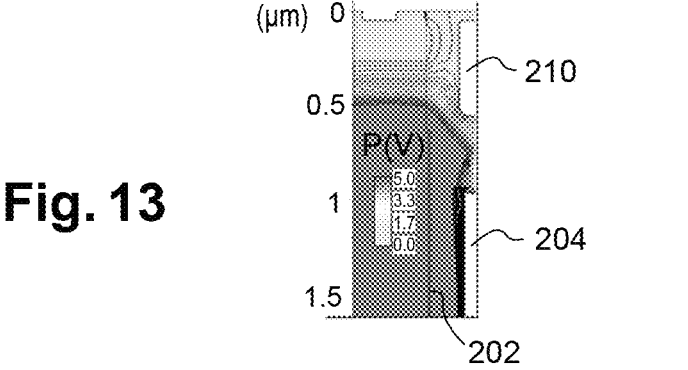
FIG. 13 is a detail view of FIG. 12.
Figure 14:
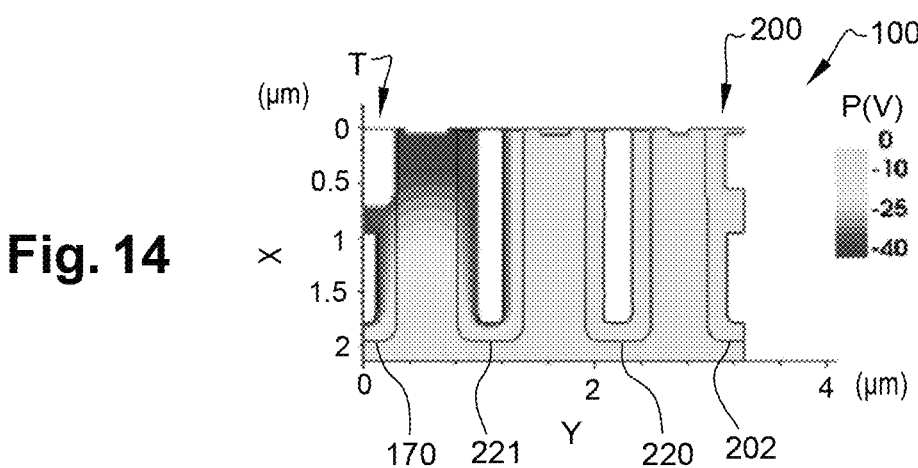
FIG. 14 is a view similar to FIG. 12 in a second operating configuration.
Figure 15:
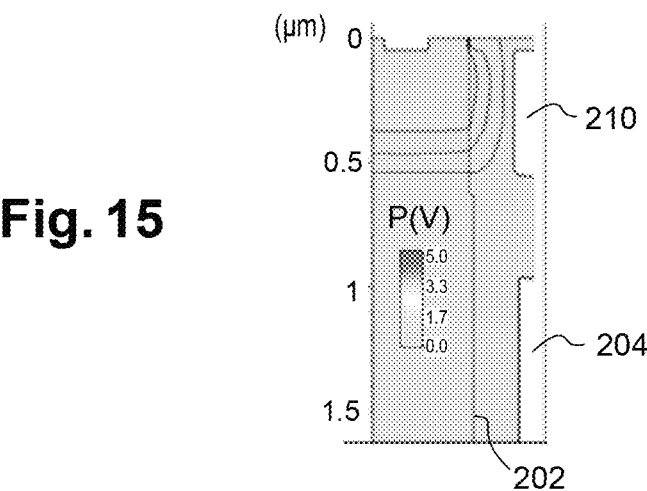
FIG. 15 is a detail view of FIG. 14.
Figure 16:
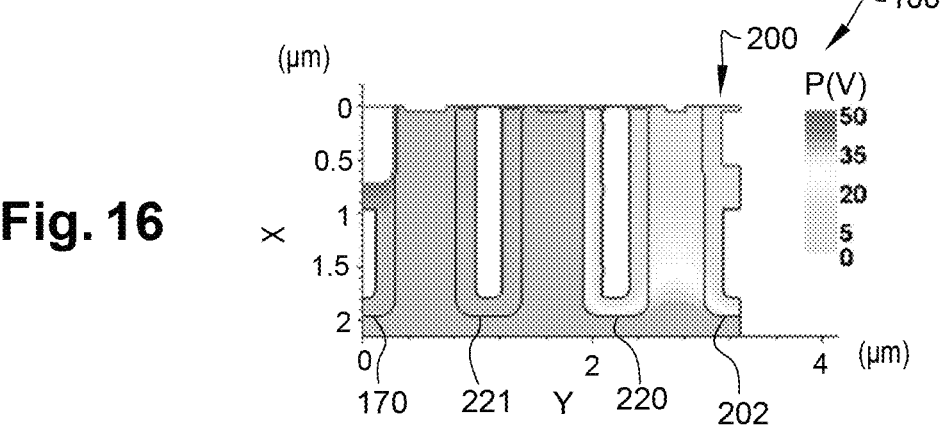
FIG. 16 is a view similar to FIG. 12 in a third operating configuration.
Figure 17:
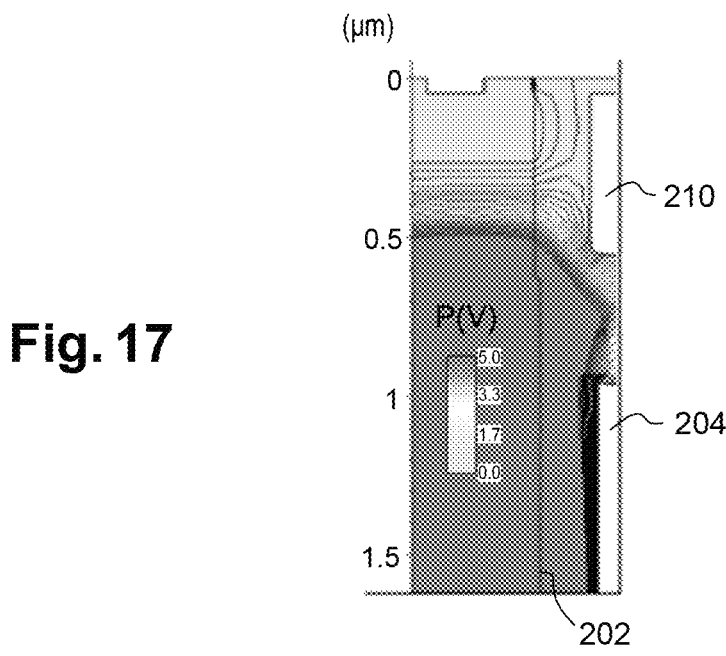
FIG. 17 is a detail view of FIG. 16.

FIGS. 12 to 17 are partial simplified lateral cross-section views of device 100 illustrating, in grey scale, the potentials P in device 100. FIGS. 13, 15, and 17 are enlarged views respectively of FIGS. 12, 14, and 16.

FIGS. 12 and 13 illustrate a first simulation where transistors T are in the conductive state. The drain of each transistor T was at a potential of approximately 40 V, the voltage between the gate and the source of each transistor T was approximately 0 V, and the potential at the source of each transistor T was approximately 0 V.

FIGS. 14 and 15 illustrate a second simulation where transistors T are in the non-conductive state. The drain of each transistor T was at a potential of approximately 40 V, the voltage between the gate and the source of each transistor T was approximately 0 V, and the potential at the source of each transistor T was approximately 0 V. FIGS. 16 and 17 illustrate a third simulation corresponding to a disconnection of the power supply of device 100. The drain of each transistor T was at a potential of approximately 0 V, the voltage between the gate and the source of each transistor T was approximately −40 V, and the potential at the source of each transistor T was approximately −40 V.

As shown in FIGS. 12 to 17, the potential around the semiconductor region 210 contained in component trench 202 remains substantially equal to 0 V whatever the potentials applied to transistors T. The operation of electronic component 200 is thus not disturbed by the operation of transistors T.

Figure 18:
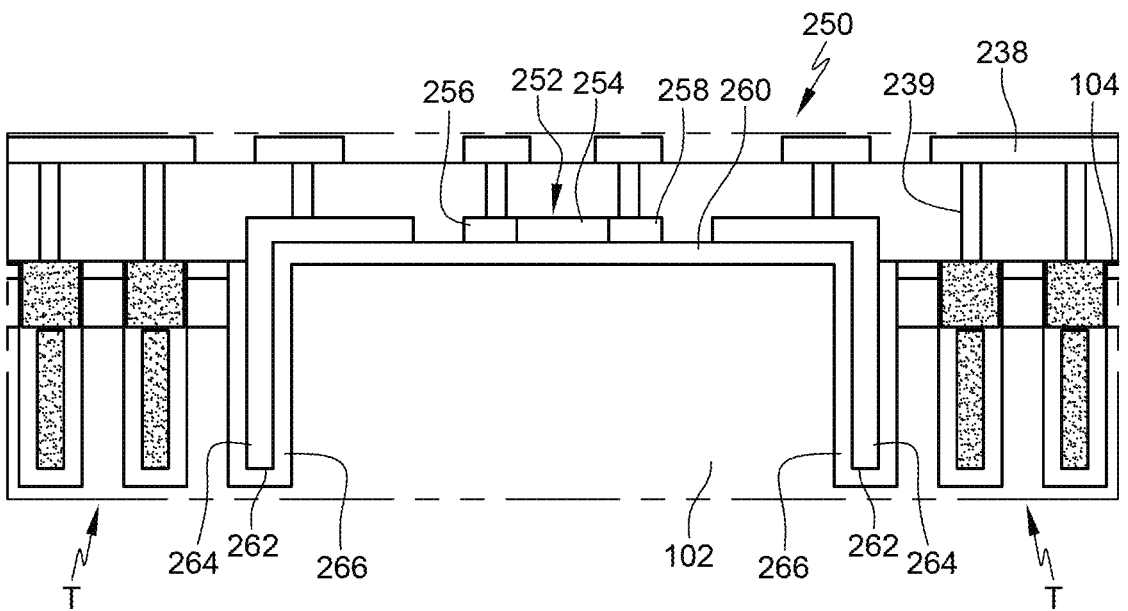
FIG. 18 is a partial simplified lateral cross-section view of an embodiment of a device comprising transistors and an additional electronic component.

FIG. 18 is a partial simplified cross-section view of a device 250 comprising all the elements of device 100, with the difference that electronic component 200 is not present, but is replaced with an electronic component 252 located on the front side 104 of substrate 102. As an example, component 250 comprises an optionally doped polysilicon strip 254 having more heavily doped semiconductor regions 256, 258 of opposite conductivity types formed therein. Polysilicon strip 254 is separated from substrate 102 by an insulating layer 260.

Device 250 further comprises trenches 262, which extend in substrate 102 from the front side 104 of substrate 102. For each trench 262, device 250 comprises an electrically-conductive element 264 located in trench 260 and an insulating layer 266 that separates conductive element 262 from substrate 102. Trenches 262 delimit the regions of substrate 102 containing transistors T and enable to ensure the holding of the potentials in the regions of substrate 102 containing transistors T. Component 252 is formed on a region of the substrate containing no transistors T.

An advantage of device 100 over device 250 is that the forming of component 200 is simultaneous to that of transistors T. For example, certain steps of manufacturing of component 200, particularly the etching of component trench 202 and of protection trenches 220, the forming of conductive elements 204, 222, 223, the dopant implantation steps for the forming of semiconductor regions 214 and 216 are common to those already implemented during the manufacturing of transistors T. Conversely, the manufacturing of component 252 requires additional steps of deposition, etching, dopant implantation, etc., with respect to the method of manufacturing transistors T since they have to be implemented after the manufacturing of transistors T.

Further, when component 200, 252 is a diode used to measure the temperature of transistors T, device 100 has the advantage that the distance separating component 200 from transistors T is decreased with respect to the distance separating component 252 from transistors T. This advantageously enables to more accurately detect the temperature of transistors T. Further, this advantageously enables to more rapidly detect a change in the temperature of transistors T.

Various embodiments and variants have been described. It will be understood by those skilled in the art that certain features of these various embodiments and variants may be combined, and other variants will occur to those skilled in the art. For example, the transistors T have been described with a well 130 connected to a well terminal B of the transistor for the well biasing. As a variant, wells 130 may be left floating in the space between component trench 202 and the protection trench and in the space between protection trenches 220 and 221.

Finally, the practical implementation of the embodiments and variants described herein is within the capabilities of those skilled in the art based on the functional indications provided hereinabove.

Electronic device (100) may be summarized as including a semiconductor substrate (102), transistors (T) having their gates (120) contained in first trenches (170) extending in the substrate, and at least one electronic component (200), different from a transistor, at least partly formed in a first semiconductor region (210) contained in a second trench (202) extending in the semiconductor substrate parallel to the first trenches.

Electronic device may further include a first electrically-conductive element (204) located in the second trench (202), the first semiconductor region (210) extending in the first electrically-conductive element; a first electrically insulating layer (206) between the first electrically-conductive element and the semiconductor substrate (102); and a second electrically-insulating layer (212) between the first semiconductor region and the first electrically-conductive element.

Electronic device may further include at least one third trench (220) extending in the semiconductor substrate (102) at least over a portion along the second trench (220), between the second trench and one of the first trenches (170); a second electrically-conductive element (222) contained in the third trench; and a third electrically-insulating layer (224) between the second electrically-conductive element and the semiconductor substrate.

Electronic device may include two third trenches (220) extending in the semiconductor substrate (102) on either side of the second trench (202).

Each third trench (220) may be totally separate from the second trench (202).

Each third trench (220) may meet at each end the second trench (202), the second electrically-conductive element (222) being contiguous to the first electrically-conductive element (204).

Electronic device may further include a fourth trench (221) extending in the semiconductor substrate (102) and totally surrounding the second trench (202) and each third trench (220), the first trenches being on the side of the fourth trench opposite to the second trench; a third electrically-conductive element (223) contained in the fourth trench; and a fourth electrically-insulating layer (225) between the third electrically-conductive element and the semiconductor substrate.

Each transistor (T) may include a fifth electrically-insulating layer (124) between the gate (120) of the transistor and the semiconductor substrate (102) and forming the gate insulator of the transistor; a fourth electrically-conductive element (180) located in the first trench (170); a sixth electrically-insulating layer (184) between the fourth electrically-conductive element and the semiconductor substrate; a seventh electrically-insulating layer (186) between the fourth electrically-conductive element and the gate; a second semiconductor region (150) of the semiconductor substrate (102), delimited by the first trench (170) containing the gate; and a semiconductor well (130) in contact with the second semiconductor region and the gate insulator, and having the transistor channel located therein.

The first semiconductor region (210) may be doped with a first conductivity type, the electronic device may further include at least third and fourth semiconductor regions (214, 216) extending in the first semiconductor region and more heavily doped than the first semiconductor region.

Electronic device may include second trenches (202) extending in the semiconductor substrate (102) and first semiconductor regions (210) each contained in one of the second trenches, each first semiconductor region (210) being doped with a first conductivity type, the electronic device may further include third and fourth semiconductor regions (214, 216) extending in each first semiconductor region and more heavily doped than the first semiconductor regions.

Electronic device may include third and fourth semiconductor regions (214, 216) extending in the first semiconductor region and more heavily doped than the first semiconductor region.

The third semiconductor regions (214) may be electrically connected in parallel and the fourth semiconductor regions (216) may be electrically connected in parallel.

Said at least one of the third semiconductor regions (214) may be electrically connected in series to one of the fourth semiconductor regions (216).

The electronic component (200) may be a diode, the third semiconductor region (214) being doped with the first conductivity type and the fourth semiconductor region (216) being doped with a second conductivity type opposite to the first conductivity type.

The electronic component (200) may be a resistor, the third and fourth semiconductor regions (214, 216) being doped with the first conductivity type.

The first trenches (170) and the second trench (202) may be simultaneously formed.

In operation, the first electrically-conductive element (204) and the second electrically-conductive element (222) may be electrically connected to a source of a reference potential (GND).

In operation, the third electrically-conductive element (223) may be electrically connected to the fourth electrically-conductive elements (180).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a semiconductor substrate;
   a first trench and a second trench extending in the semiconductor substrate, the first trench and the second trench are parallel to one another;
   a first electrically insulating layer in the second trench and partially filling the second trench;
   a first electrically-conductive element in the second trench, on the first electrically insulating layer, and partially filling the second trench, the first electrically-conductive element is separated from the semiconductor substrate by the first electrically insulating layer;
   a second electrically insulating layer in the second trench, on the first electrically-conductive element, and partially filling the second trench;
   a first semiconductor region recessed into the first electrically-conductive element within the second trench, the first semiconductor region is on the second electrically insulating layer, and the first semiconductor region has a first conductivity type, the first semiconductor region contacts the first electrically insulating layer and the second electrically insulating layer, and the first semiconductor region is separated from the first electrically-conductive element by the second electrically insulating layer;

a first doped semiconductor region within the second trench, the first doped semiconductor region is within the first semiconductor region, and the first doped semiconductor region has a second conductivity type opposite to the first conductivity type;
   a second doped semiconductor region within the second trench, the second doped semiconductor region is within the first semiconductor region, the second doped semiconductor region has the first conductivity type, and the second doped semiconductor region is spaced apart from the first doped semiconductor region by a respective portion of the first semiconductor region between the first doped semiconductor region and the second doped semiconductor region;
   a transistor having a gate contained in the first trench; and
   wherein an electronic component, different from the transistor, at least partly defined by the first semiconductor region, the first doped semiconductor region, and the second doped semiconductor region, and the electronic component is at least partly contained within the second trench.

2. The electronic device according to claim 1, further comprising:
   at least one third trench extending in the semiconductor substrate at least along a portion of the semiconductor substrate between the second trench and the first trench;
   a second electrically-conductive element contained in the third trench; and
   a third electrically-insulating layer between the second electrically-conductive element and the semiconductor substrate.

3. The electronic device according to claim 2, wherein the at least one third trench includes two third trenches extending in the semiconductor substrate on either side of the second trench.

4. The electronic device according to claim 2, wherein each third trench of the at least one third trench is totally separate from the second trench.

5. The electronic device according to claim 2, wherein each third trench meets at each end the second trench, the second electrically-conductive element being contiguous to the first electrically-conductive element.

6. The electronic device according to claim 2, further comprising:
   a fourth trench extending in the semiconductor substrate and totally surrounding the second trench and the at least one third trench, the first trench being on a side of the fourth trench opposite to the second trench;
   a third electrically-conductive element contained in the fourth trench; and
   a fourth electrically-insulating layer between the third electrically-conductive element and the semiconductor substrate.

7. The electronic device according to claim 6, wherein the transistor comprises:
   a fifth electrically-insulating layer between the gate of the transistor and the semiconductor substrate and forming a gate insulator of the transistor;
   a fourth electrically-conductive element located in the first trench;
   a sixth electrically-insulating layer between the fourth electrically-conductive element and the semiconductor substrate;
   a seventh electrically-insulating layer between the fourth electrically-conductive element and the gate;

17 a second semiconductor region of the semiconductor substrate, delimited by the first trench containing the gate; and a semiconductor well in contact with the second semiconductor region and the gate insulator, and having a channel of the transistor located therein.

8. The electronic device according to claim 7, wherein, in operation, the first electrically-conductive element and the second electrically-conductive element are configured to be electrically connected to a source of a reference potential, and the third electrically-conductive element is configured to be electrically connected to the fourth electrically-conductive element.

9. The electronic device according to claim 1, wherein the electronic component is a diode.

10. The electronic device of claim 1, wherein the second doped semiconductor region is more heavily doped than the first semiconductor region.

11. An electronic device comprising:

a semiconductor substrate;

a first trench and a second trench in the semiconductor substrate, the first trench and the second trench parallel to one another;

a first transverse trench in the semiconductor substrate, the first transverse trench that extends from the first trench and the second trench;

a first electrically insulating layer in and partially filling the first trench, the second trench, and the first transverse trench;

a first electrically-conductive element in and partially filling the first trench, the second trench, and the first transverse trench, the first electrically-conductive element is separated from the semiconductor substrate by the first electrically insulating layer;

a second electrically insulating layer in the first trench, on the first electrically-conductive element, and partially filling the first trench;

a semiconductor region recessed into the first electrically-conductive element within the first trench, the semiconductor region is on the second electrically insulating layer, and the semiconductor region has a first conductivity type, the semiconductor region contacts the first electrically insulating layer and the second electrically insulating layer, and the semiconductor region is separated from the first electrically-conductive element by the second electrically insulating layer;

a first doped semiconductor region within the first trench, the first doped semiconductor region is within the semiconductor region, and the first doped semiconductor region has a second conductivity type opposite to the first conductivity type;

a second doped semiconductor region within the second trench, the second doped semiconductor region is within the semiconductor region, the second doped semiconductor region has the first conductivity type, and the second doped semiconductor region is spaced apart from the first doped semiconductor region by a respective portion of the first semiconductor region between the first doped semiconductor region and the second doped semiconductor region;

a transistor having a gate in a transistor trench; and an electronic component, different from the transistor, at least partly defined by the semiconductor region, the first doped semiconductor region, and the second doped semiconductor region, and the electronic component at least partly contained within the first trench.

12. The electronic device according to claim 11, further comprising:

a third trench in the semiconductor substrate and totally surrounding the first trench, the second trench, and the first transverse trench.

13. The electronic device of claim 11, further comprising a second transverse trench parallel to the first transverse trench, the second transverse trench extends from the first trench to the second trench.

14. The electronic device of claim 13, wherein the first transverse trench and the second transverse trench are separated from each other by the first trench and the second trench.

15. The electronic device of claim 11, wherein the electronic component is a diode.

16. An electronic device comprising:

a semiconductor substrate;

a first trench extending into the semiconductor substrate;

a pair of second trenches extending into the semiconductor substrate, the pair of second trenches are separated from each other by the first trench, the pair of second trenches are parallel with the first trench, and the first trench is between the pair of second trenches;

a pair of transverse trenches that are transverse to the first trench and the pair of second trenches, the pair of transverse trenches extend between respective ends of the first trench and the pair of second trenches, the pair of transverse trenches are separated from each other by the first trench and the pair of second trenches, and the first trench and the pair of second trenches are between the pair of transverse trenches;

a first electrically insulating layer in and partially filling the first trench, the pair of second trenches, and the pair of transverse trenches;

an electrically-conductive element in the first trench, the pair of second trenches, and the pair of transverse trenches, the electrically-conductive element is spaced apart from the semiconductor substrate by the first electrically insulating layer;

a second electrically insulating layer in the first trench, on the electrically-conductive element, and partially filling the first trench;

a first semiconductor region recessed into the electrically-conductive element within the first trench, the first semiconductor region is on the second electrically insulating layer, and the first semiconductor region has a first conductivity type, the first semiconductor region contacts the first electrically insulating layer and the second electrically insulating layer, and the first semiconductor region is separated from the electrically-conductive element by the second electrically insulating layer;

a first doped semiconductor region within the second trench, the first doped semiconductor region is within the first semiconductor region, and the first doped semiconductor region has a second conductivity type opposite to the first conductivity type;

a second doped semiconductor region within the second trench, the second doped semiconductor region is within the first semiconductor region, the second doped semiconductor region has the first conductivity type, and the second doped semiconductor region is spaced apart from the first doped semiconductor region by a respective portion of the first semiconductor region between the first doped semiconductor region and the second doped semiconductor region;

a transistor trench extending into the semiconductor substrate, the transistor trench is spaced apart from the pair of second trenches;

a gate of a transistor contained within the transistor trench; and wherein an electronic component, different from the transistor, at least partly in the first trench and at least partly defined by the first semiconductor region, the first doped semiconductor region, and the second doped semiconductor region.

17. The electronic device of claim 16, further comprising a third trench extending into the semiconductor substrate, and the third trench is between a respective one of the pair of second trenches and the transistor trench.

18. The electronic device of claim 17, wherein the third trench surrounds the first trench, the pair of second trenches, and the pair of transverse trenches.

19. The electronic device of claim 16, wherein the pair of second trenches and the pair of transverse trenches surround the first trench.

20. The electronic device of claim 16, wherein the electronic component is a diode.

* * * * *